United States Patent
Thorp et al.

(10) Patent No.: US 7,580,298 B2
(45) Date of Patent: Aug. 25, 2009

(54) METHOD FOR MANAGING ELECTRICAL LOAD OF AN ELECTRONIC DEVICE

(75) Inventors: Tyler Thorp, Sunnyvale, CA (US); Ken So, Belmont, CA (US)

(73) Assignee: SanDisk 3D LLC, Milpitas, CA (US)

( * ) Notice: Subject to any disclaimer, the term of this patent is extended or adjusted under 35 U.S.C. 154(b) by 91 days.

(21) Appl. No.: 11/694,746

(22) Filed: Mar. 30, 2007

(65) Prior Publication Data

US 2008/0239836 A1    Oct. 2, 2008

(51) Int. Cl.
*G11C 5/14* (2006.01)
(52) U.S. Cl. ............... 365/189.09; 365/189.07; 365/226
(58) Field of Classification Search ............ 365/189.09, 365/189.06, 185.23, 226, 189.07; 327/540–541; 323/350–351, 282–283
See application file for complete search history.

(56) References Cited

U.S. PATENT DOCUMENTS

| | | | |
|---|---|---|---|
| 5,508,971 A | 4/1996 | Cernea et al. | |
| 5,563,825 A | 10/1996 | Cernea et al. | |
| 5,568,424 A | 10/1996 | Cernea et al. | |
| 5,592,420 A | 1/1997 | Cernea et al. | |
| 5,621,685 A | 4/1997 | Cernea et al. | |
| 5,693,570 A | 12/1997 | Cernea et al. | |
| 5,946,258 A | 8/1999 | Evertt et al. | |
| 6,134,145 A | 10/2000 | Wong | |
| 6,229,732 B1 | 5/2001 | Lin et al. | |
| 6,314,025 B1 | 11/2001 | Wong | |
| 6,370,075 B1 | 4/2002 | Haeberli et al. | |
| 6,385,086 B1 | 5/2002 | Mihara et al. | |
| 6,438,462 B1 * | 8/2002 | Hanf et al. ................ | 700/297 |
| 6,486,728 B2 | 11/2002 | Kleveland | |
| 6,525,949 B1 | 2/2003 | Johnson et al. | |
| 6,556,465 B2 | 4/2003 | Haeberli et al. | |
| 6,577,535 B2 | 6/2003 | Pasternak | |
| 6,586,971 B1 * | 7/2003 | Naffziger et al. .......... | 327/41 |
| 6,606,267 B2 | 8/2003 | Wong | |
| 6,693,412 B2 * | 2/2004 | Ruan et al. ................ | 323/282 |
| 6,696,867 B2 * | 2/2004 | Keeth et al. ................ | 327/58 |
| 6,760,262 B2 | 7/2004 | Haeberli et al. | |
| 6,922,096 B2 | 7/2005 | Cernea | |
| 6,937,948 B2 | 8/2005 | Rajguru | |
| 6,944,034 B1 * | 9/2005 | Shteynberg et al. ....... | 363/21.13 |
| 6,944,058 B2 | 9/2005 | Wong | |
| 7,023,260 B2 | 4/2006 | Thorp et al. | |
| 7,030,683 B2 | 4/2006 | Pan et al. | |

(Continued)

OTHER PUBLICATIONS

U.S. Appl. No. 11/618,539, entitled "Unified Voltage Generation apparatus with Improved Power Efficiency", filed Dec. 29, 2006.

(Continued)

*Primary Examiner*—Gene N. Auduong

(57) ABSTRACT

Methods and apparatus for managing electrical loads of electronic devices are disclosed. According to one embodiment, a current load imposed by an electronic device, such as a memory device (or memory system), can be measured. Then, using the measured current load, the memory device can determine whether (and to what extent) operational performance should be limited. By limiting operational performance, the memory device is able to limit its current load so as to satisfy a specification criterion or other requirement. The electrical load management is well suited for use in portable memory products (e.g., memory cards) to manage current loads being drawn.

19 Claims, 7 Drawing Sheets

U.S. PATENT DOCUMENTS

| | | | |
|---|---|---|---|
| 7,049,802 B2 * | 5/2006 | Ruan et al. | 323/351 |
| 7,075,276 B2 * | 7/2006 | Morales | 323/246 |
| 7,113,023 B2 | 9/2006 | Cernea | |
| 2003/0006650 A1 * | 1/2003 | Tang et al. | 307/43 |
| 2005/0248386 A1 | 11/2005 | Pan et al. | |
| 2005/0249022 A1 | 11/2005 | Martines et al. | |
| 2006/0250177 A1 | 11/2006 | Thorp | |
| 2007/0126494 A1 | 6/2007 | Pan | |
| 2007/0139099 A1 | 6/2007 | Pan | |
| 2007/0139100 A1 | 6/2007 | Pan | |
| 2007/0153589 A1 * | 7/2007 | Tailliet | 365/189.06 |
| 2007/0229149 A1 | 10/2007 | Pan et al. | |
| 2008/0018377 A1 * | 1/2008 | Chung | 327/513 |
| 2008/0024096 A1 | 1/2008 | Pan | |

OTHER PUBLICATIONS

U.S. Appl. No. 11/694,798, entitled "Method for Load-Based Voltage Generation", filed Mar. 30, 2007.
U.S. Appl. No. 11/694,760, entitled "Device with Load-Based Voltage Generation", filed Mar. 30, 2007.
U.S. Appl. No. 11/618,522, entitled "Unified Voltage Generation Method with Improved Power Efficiency", filed Dec. 29, 2006.
U.S. Appl. No. 11/694,714, entitled "Load Management for Memory Device", filed Mar. 30, 2007.
U.S. Appl. No. 11/694,714, Office Action, mailed May 1, 2008.
Office Action for U.S. Appl. No. 11/694,714 mailed Dec. 31, 2008.

* cited by examiner

METHOD FOR MANAGING ELECTRICAL LOAD OF AN ELECTRONIC DEVICE

CROSS-REFERENCE TO RELATED APPLICATION

This application is related to U.S. patent application Ser. No. 11/694,714, filed concurrently herewith, and entitled "LOAD MANAGEMENT FOR MEMORY DEVICE," which is hereby incorporated herein by reference.

BACKGROUND OF THE INVENTION

1. Field of the Invention

The invention relates to electronic devices and, more particularly, to electrical load management for electronic devices, such as memory systems.

2. Description of the Related Art

Memory cards are commonly used to store digital data for use with various products (e.g., electronics products). Examples of memory cards are flash cards that use Flash type or EEPROM type memory cells to store data. Flash cards have a relatively small form factor and have been used to store digital data for products such as cameras, hand-held computers, set-top boxes, hand-held or other small audio players/recorders (e.g., MP3 devices), and medical monitors. A major supplier of flash cards is SanDisk Corporation of Fremont, Calif.

FIG. 1 is a schematic diagram of a conventional voltage generation circuit 100. The conventional voltage generation circuit 100 can provide one or more generated voltages to a memory system that provides non-volatile data storage and represents, for example, a memory card (e.g., flash card). The voltage generation circuit 100 includes a charge pump circuit 102. The charge pump circuit 102 operates to boost a lower input voltage (Vin) to produce a higher output voltage (Vout). The output voltage (Vout) is coupled to a decoupling capacitor (Cd) 104. The output voltage is also coupled to a resistor divider 106. The resistor divider 106 divides the output voltage using resistors R1 and R2. A comparator 108 couples to the resistor divider 106 and to a reference voltage (Vref). The output of the comparator 108 is fed back to the charge pump circuit 102 so that the charge pump circuit 102 can regulate the output voltage such that it remains at a substantially constant voltage level.

An output voltage, such as generated by the voltage generation circuit 100, can be supplied to a memory array that provides data storage. Typically, the voltage generation circuitry and the memory array are part of a memory system (or memory device). The memory array includes a plurality of memory elements, namely, non-volatile memory elements. One of various implementations for a non-volatile memory element is a diode or antifuse type memory element. The various memory elements within the memory array can be accessed by way of bitlines and wordlines. When programming a memory element, a voltage is applied across the memory element to invoke a physical characteristic change in the memory element. As an example, when the memory element corresponds to a diode or antifuse type device, the programming of the memory element is referred to as "popping" or "blowing" the diode or antifuse.

Electronic devices, such as memory devices, are sometimes required to operate in compliance with a specification regarding its performance. One criterion of a specification can pertain to current consumption. In the case of memory devices, at least some memory arrays have a current dependency that depends on temperature. Still further, some memory arrays have a current consumption that depends on the particular data being stored in the memory array.

Conventionally, to ensure that current consumption of a memory device does not exceed a specification's criterion, performance of the memory device is limited in certain situations. For example, one high current consuming operation of a memory device is writing (i.e., programming) of its memory array. When writing to the memory array, temperature and data dependencies can significantly impact the current consumption. One conventional approach is to restrict the number of memory cells in the memory array that are able to be concurrently written (i.e., write bandwidth is restricted) whenever the temperature is elevated. Unfortunately, however, conventional approaches do not take into consideration data dependency. As a result, the performance of the memory device would often be undesirably limited beyond what would be required to satisfy a specification or other requirement.

SUMMARY OF THE INVENTION

The invention relates to a managing an electrical load for an electronic device. According to one embodiment of the invention, a current load imposed by an electronic device, such as a memory device (or memory system), is measured. Then, using the measured current load, the memory device determines whether (and to what extent) operational performance should be limited. By limiting operational performance, the memory device is able to limit its current load so as to satisfy a specification criterion or other requirement.

The invention can be implemented in numerous ways, including as a method, system, device or apparatus. Several embodiments of the invention are discussed below.

As a method for generating a voltage for electronic circuitry within an integrated circuit package, one embodiment of the invention can includes at least: generating a regulated voltage from a lower supply voltage; supplying the regulated voltage to the electronic circuitry, the electronic circuitry imposing an electrical load on the regulated voltage; monitoring the electrical load on the regulated voltage due at least in part to the electronic circuitry; and altering operability of the electronic circuitry based on the monitored electrical load.

As a method for operating a portable and removable data storage product, the portable and removable data storage product includes a memory array of non-volatile memory elements, one embodiment of the invention can include at least: generating a regulated voltage from a lower supply voltage, the regulated voltage having an associated strength; supplying the regulated voltage to the memory array, the memory array imposing a load on the regulated voltage; monitoring an electrical load due at least in part to the load imposed on the regulated voltage by the memory array; and controlling access to the memory array based on the monitored electrical load.

Other aspects and advantages of the invention will become apparent from the following detailed description taken in conjunction with the accompanying drawings which illustrate, by way of example, the principles of the invention.

BRIEF DESCRIPTION OF THE DRAWINGS

The invention will be readily understood by the following detailed description in conjunction with the accompanying drawings, wherein like reference numerals designate like structural elements, and in which.

DETAILED DESCRIPTION OF THE INVENTION

The invention relates to a managing an electrical load for an electronic device. According to one embodiment of the invention, a current load imposed by an electronic device, such as a memory device (or memory system), is measured. Then, using the measured current load, the memory device determines whether (and to what extent) operational performance should be limited. In one implementation, an input current to the memory device can be directly measured. In another implementation, an output current being supplied to a memory array within the memory device can be measured since the output current is a function of the input current. Consequently, by measuring the output current, the input current is indirectly determined. By limiting operational performance, the memory device is able to limit its current load so as to satisfy a specification criterion or other requirement.

Voltage generation according to one embodiment of the invention is well suited for use in a portable memory product. For example, voltage generation can be provided within a portable data storage device (e.g., memory card or other compact modular memory device) to generate one or more internal voltages. More generally, voltage generation can be provided in an integrated circuit product.

Embodiments of the invention are discussed below with reference to FIGS. 2-7. However, those skilled in the art will readily appreciate that the detailed description given herein with respect to these figures is for explanatory purposes as the invention extends beyond these limited embodiments.

Figure 1:
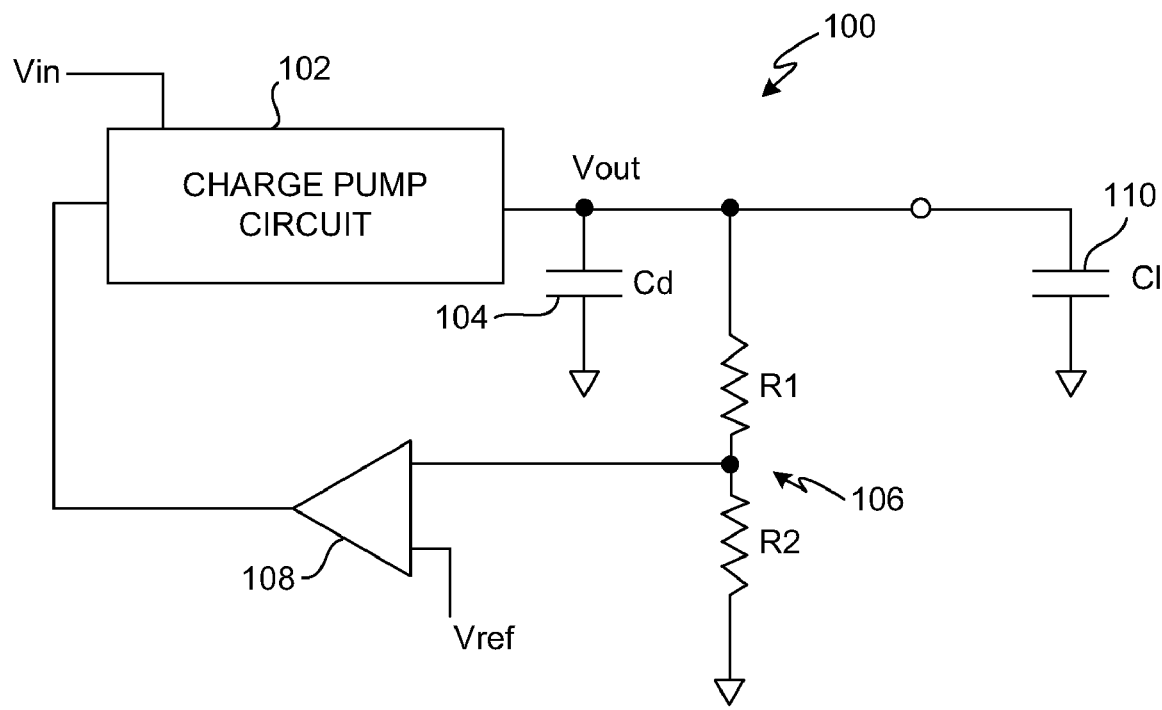
FIG. 1 is a schematic diagram of a conventional voltage generation circuit.
Figure 2:
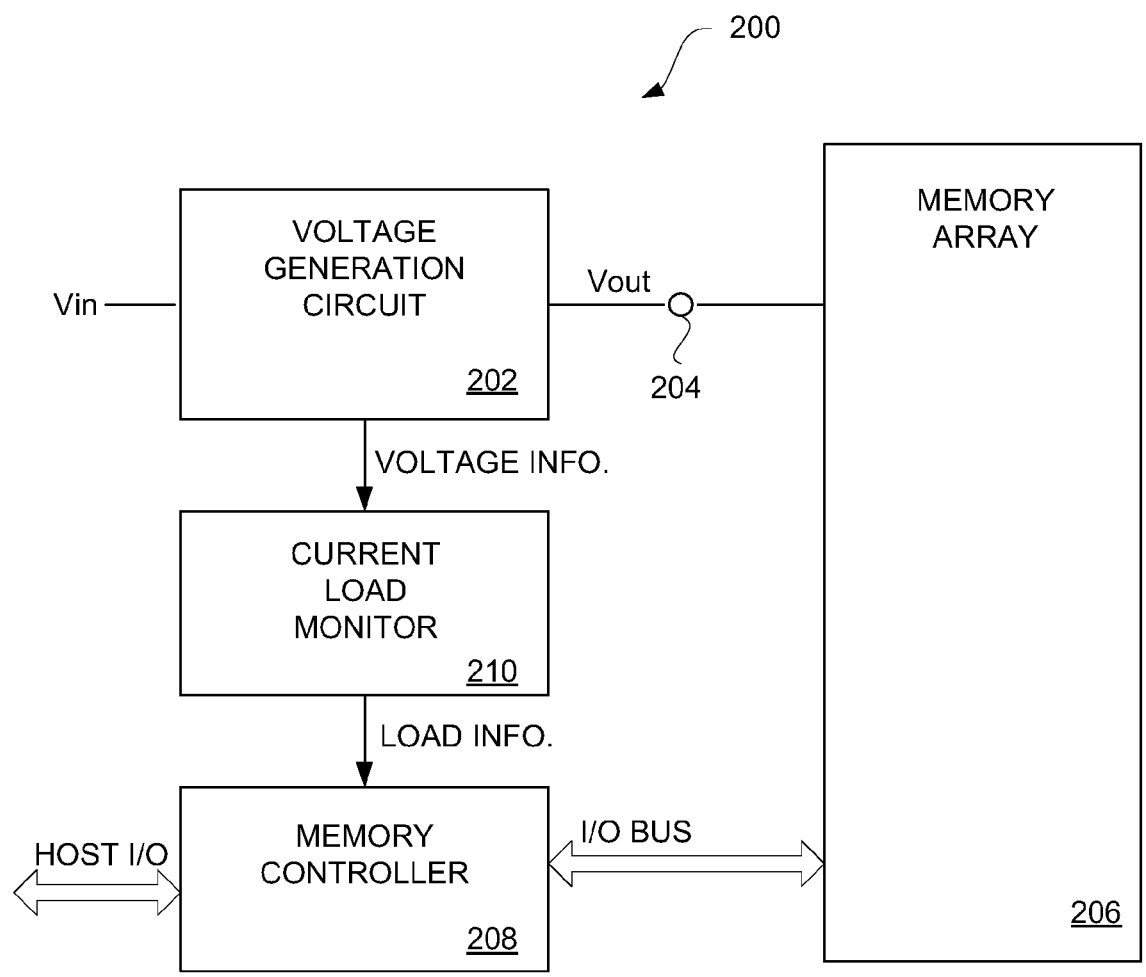
FIG. 2 is a block diagram of a memory device according to one embodiment of the invention.

FIG. 2 is a block diagram of a memory device 200 according to one embodiment of the invention. The memory device 200 includes a voltage generation circuit 202. The voltage generation circuit 202 receives an input voltage (Vin) and generates an output voltage (Vout) at an output terminal 204 of the voltage generation circuit 202. The output voltage (Vout) is greater than the input voltage (Vin). In one embodiment, the voltage generation circuit 202 includes one or more charge pumps to produce the output voltage (Vout). A memory array 206 couples to the output terminal 204 to receive the output voltage (Vout). The memory array 206 provides data storage for the memory device 200. The memory array 206 typically includes a plurality of memory elements. The memory elements can be non-volatile memory cells. In one embodiment, the non-volatile memory cells are anti-fuse or diode-based memory cells. In one embodiment, the non-volatile memory elements can be arranged in a plurality of layers stacked vertically above one another.

The memory array 206 also couples to a memory controller 208. The memory controller 208 can communicate with a host device (not shown) using a host input/output (I/O) bus and can also communicate with the memory array 206 using an I/O bus. For example, when the memory controller 208 is instructed to read or write data from or to the memory array 206, the memory controller 208 can communicate with the memory array 206 via the I/O bus.

In the case in which a specification or other requirement suggests or requires that the memory device 200 not impose a current load on a supply voltage beyond a certain amount, the memory device 200 can be operated to satisfy or nearly satisfy the specification or requirement. For example, the specification or requirement can indicate that the current load imposed on the input voltage (Vin) not exceed a certain limit. Since the memory device 200 can be operated in a variety of different ways to perform different functions, the current load on the input voltage (Vin) tends to be dynamic over time. However, in one embodiment, the memory array 206 draws more current when the temperature is higher. Also, in one embodiment, the memory array 206 consumes more current when more memory cells are programmed. In other words, current consumption by the memory array 206 is dependent on the data stored in the memory array 206.

According to one embodiment of the invention, the memory device 200 further includes a current load monitor 210. The current load monitor 210 can couple to the voltage generation circuit 202 to receive voltage information. The voltage information being provided by the voltage generation circuit 202 assists the current load monitor 210 in determining load information that is provided to the memory controller 208. In one implementation, the voltage information provided by the voltage generation circuit 202 pertains to the output voltage (Vout) produced by the voltage generation circuit 202. The current load monitor 210 can then determine the current load at the output terminal 204 of the voltage generation circuit 202. The current load at the output terminal 204 can then be compared to one or more threshold values to determine whether the current load is excessive. When the current load is determined to be excessive, the load information provided to the memory controller 208 can inform the memory controller 208 that action should be taken to reduce the current load being drawn by the memory array 206. For example, the memory controller 208 could operate to restrict read or write bandwidth in such situations. By restricting the read or write bandwidth, the current load imposed by the memory array 206 is reduced or at least limited. Accordingly, by monitoring the current load, the temperature and data dependency associated with the current load imposed by a memory array can be considered, dynamically evaluated and then utilized to regulate the current load as appropriate.

The current load monitored 210 monitors the current load at the output terminal 204 of the voltage generation circuit 202. In this embodiment, the current load being monitored can be considered an output current such its the current load that is being primarily or exclusively drawn by the memory array 206. In the case where the current load on a supply voltage is not to exceed a certain amount as per a specification or other requirement, the current load which pertains to the output current utilized since the output current is representative of the input current. Hence, either an input current or an output current can be monitored and considered such that the memory device 200 can be operated to satisfy or nearly satisfy the specification or requirement.

Figure 3:
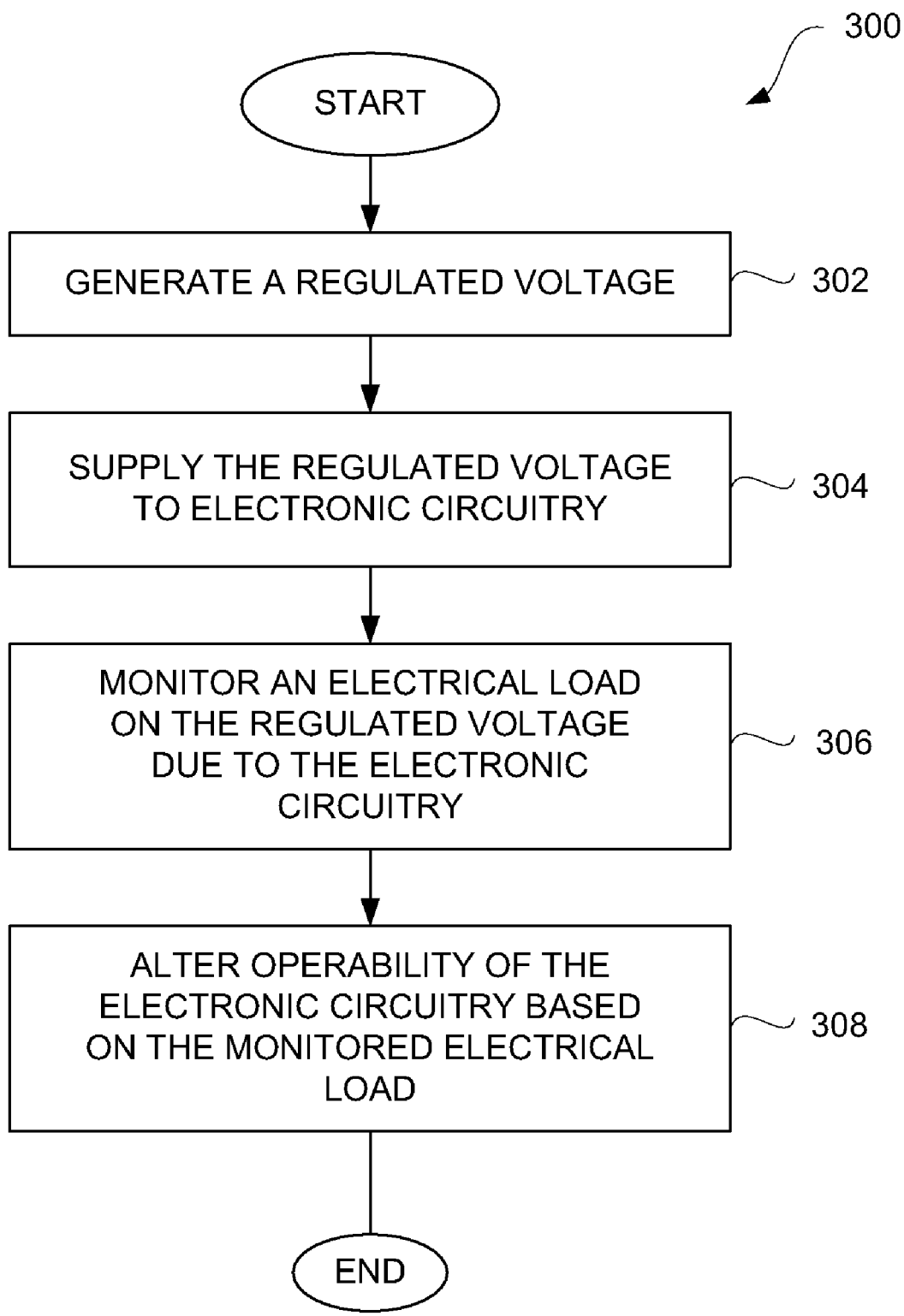
FIG. 3 is a flow diagram of an electrical load monitoring process according to one embodiment of the invention.

FIG. 3 is a flow diagram of an electrical load monitoring process 300 according to one embodiment of the invention. The electrical load monitoring process 300 is, for example, performed by a device including electronic circuitry. For example, the electrical load monitoring process 300 can, for example, be performed by the memory device 200 illustrated in FIG. 2.

The electrical load monitoring process 300 generates 302 a regulated voltage. The regulated voltage can then be supplied 304 to electronic circuitry. Once the regulated voltage is supplied to the electronic circuitry, the electronic circuitry can impose an electrical load on the regulated voltage. In one implementation, the electrical load corresponds to a current load. The electrical load on the regulated voltage due to the electronic circuitry can then be monitored 306. By monitoring 306 the electrical load in real-time, the actual electrical load can be utilized. In particular, operability of the electronic circuitry can be altered 308 based on the monitored electrical load. Typically, in the event that the electrical load is deemed high or excessive, the electrical load can be reduced by altering 308 operability of the electronic circuitry.

Depending upon the nature of the electronic circuitry, operability of the electronic circuitry can be altered 308 in a variety of different ways. For example, when the electronic circuitry is associated with a memory array that consumes significant electrical energy during certain operations, the rate at which these electrical operations are performed can be restricted. For example, assume that the monitored electrical load can be categorized into one of three classifications, low, moderate or high. Assume also that the electronic circuitry is associated with a memory device that has a plurality of memory banks within a memory array, with each bank having a plurality of memory elements (e.g., memory cells). These memory banks can be written with data concurrently or individually. Typically, for best performance, the write operation to the memory array would write to all available memory banks in parallel. This maximizes write bandwidth but also imposes potentially high current loads that can be problematic. Hence, if the monitored electrical load is deemed too high, the write bandwidth of the electronic circuitry can be restricted, thereby reducing the current load being imposed. Table I below indicates one exemplary approach to current load.

TABLE I

| CURRENT LOAD | WRITE BANDWIDTH |
|---|---|
| Low | 100% |
| Moderate | 50% |
| High | 25% |

Therefore, as shown in Table I, if the monitored current load is determined to be low, then the write bandwidth need not be restricted. If the monitored current load is determined to be moderate, the write bandwidth could be restricted to 50% of its maximum capability. For example, if the memory array has four distinct memory banks that can be concurrently written, when the monitored current load is moderate, only half of the memory banks would be concurrently written. Still further, if the monitored current load is determined to be high, then the write bandwidth can be restricted to 25% of its maximum. For example, only one out of four memory banks would be concurrently utilized during a write operation. By restricting write bandwidth in this manner, problematic high current loads can be minimized or avoided. Hence, memory devices having temperature and/or data dependencies are able to manage their current load so as to satisfy a specification criterion or other requirement.

Figure 4:
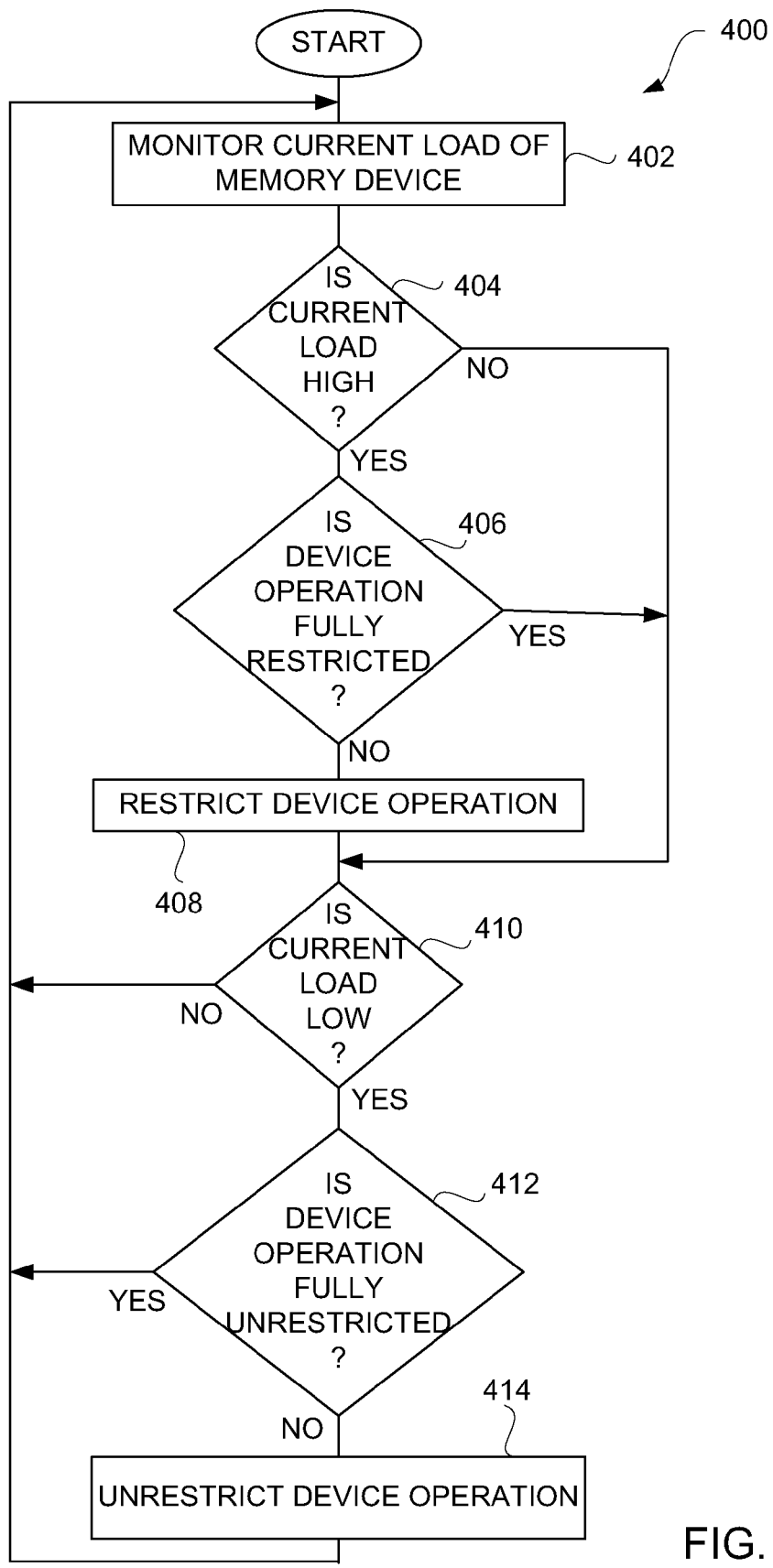
FIG. 4 is a flow diagram of a device operability process according to one embodiment of the invention.

FIG. 4 is a flow diagram of a device operability process 400 according to one embodiment of the invention. The device operability process 400 is, for example, performed by a memory device, such as the memory device 200 illustrated in FIG. 2.

The device operability process 400 monitors 402 a current load of a memory device. A decision 404 determines whether the current load is high. When the decision 404 determines that the current load is high, a decision 406 determines whether device operation is already fully restricted. When the decision 406 determines that the device operation is not already fully restricted, device operation is restricted 408. Alternatively, when the current load is determined not to be high or when the device operation is already fully restricted, the block 408 can be bypassed.

Following the block 408 or its being bypassed, a decision 410 determines whether the current load is low. When the decision 410 determines that the current load is low, a decision 412 can determine whether device operation is fully unrestricted. When the decision 412 determines that device operation is not fully unrestricted, device operation can be unrestricted 414. Here, it is determined that the device operation was previously restricted, such as due to a high current load. However, the current load is now low so that the device operation is able to be now unrestricted. Following the block 414, or following the decision 410 when the current load is not low, or also following the decision 412 when the device operation is already fully unrestricted, the device operability process 400 can return to repeat the block 402 and subsequent blocks so that the device operability process 400 can continue to monitor the current load and dynamically adjust device operation so that the current load is automatically controlled.

Figure 5:
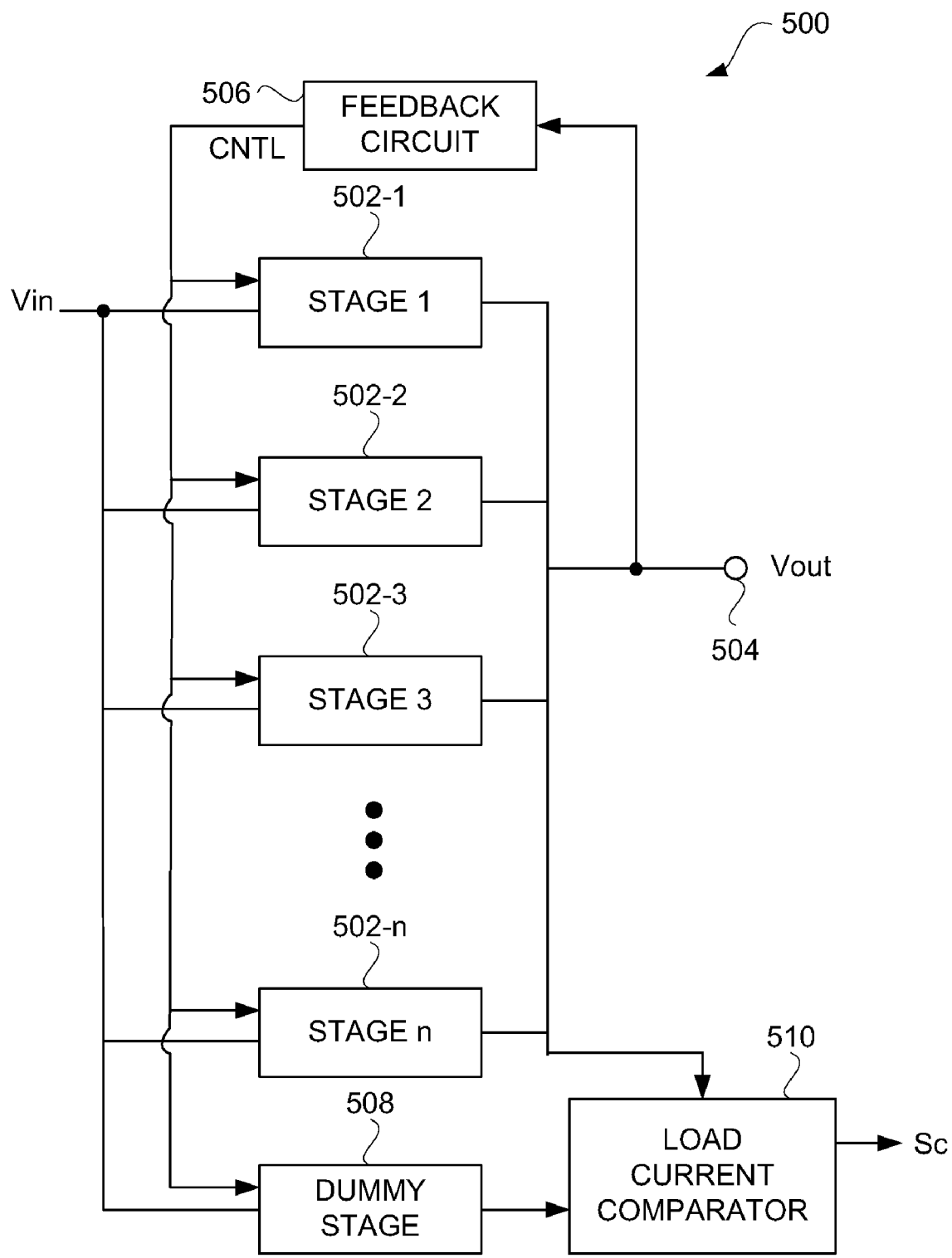
FIG. 5 is a block diagram of an electronic device according to one embodiment of the invention.

FIG. 5 is a block diagram of an electronic device 500 according to one embodiment of the invention. The electronic device 500 includes circuitry associated with a multi-stage charge pump together with a current load monitor. In this embodiment, the current load monitor is monitoring an electrical characteristic at the output of the multi-stage charge pump.

The electronic device 500 includes an n-stage charge pump including stage 1 (502-1), stage 2 (502-2), stage 3 (502-3), . . . , stage n (502-n). Each of the stages 502 receives an input voltage (Vin) and generates an output voltage (Vout) at output terminal 504. The outputs of each of the stages 502 are coupled together at the output terminal 504. To regulate the output voltage (Vout), a feedback circuit 506 couples to the output terminal 504 and feeds back a control signal (CNTL) to each of the stages 502.

In addition, the electronic device 500 can include a dummy stage 508 and a current load comparator 510. The dummy stage 508 and the current load comparator 510 can implement a current load monitor. The dummy stage 508 is similar to the stages 502 that are coupled to the output terminal 504. However, although the dummy stage 508 receives the input voltage (Vin) and the control signal (CNTL), the output of the dummy stage 508 is coupled to the load circuit comparator 510 and not coupled to the output terminal 504. In addition, the load current comparator 510 is coupled to the output terminal 504 so as to receive the output voltage (Vout). The current load comparator 510 can then determine the current load being imposed on the output terminal 504. Based on the determined current load, a comparison signal (Sc) can be output. The comparison signal (Sc) can be supplied to a memory controller or other circuitry for affecting device operability. For example, as illustrated in FIG. 2, the comparison signal (Sc) can correspond to the load information being supplied to the memory controller 208 or other circuitry for affecting device operability.

Figure 6:
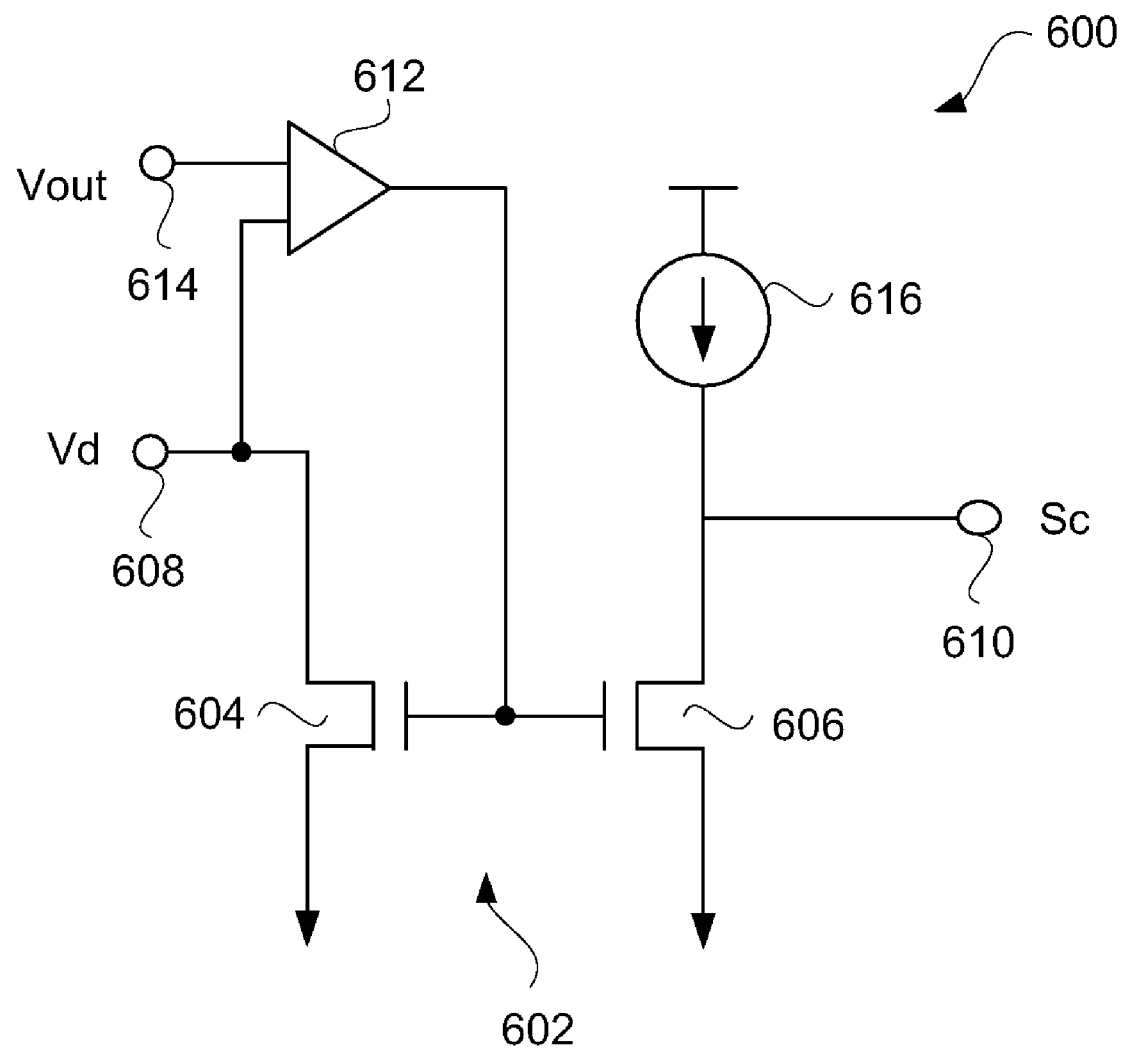
FIG. 6 is a schematic diagram of a load current comparator according to one embodiment of the invention.

FIG. 6 is a schematic diagram of a load current comparator 600 according to one embodiment of the invention. The load current comparator 600 is, for example, suitable for use as the current load comparator 510 illustrated in FIG. 5.

The current load comparator 600 includes a current mirror 602. The current mirror 602 includes a first transistor gate 604 and a second transistor gate 606. The electronic gates 604 and 606 can be field-effect transistors. The current load comparator 600 receives a dummy voltage (Vd) provided by the dummy stage 508 at a first input terminal 608. The current load comparator 600 produces the comparison signal (Sc) at an output terminal 610. The transistors 604 and 606 have their gate terminals connected together and have their source terminals connected ground. The drain terminal of the first transistor 604 is connected to the first input terminal 608, and the drain terminal of the second transistor 606 is connected to the output terminal 610. The current load comparator 600 also includes a second input terminal 614 that receives the output voltage (Vout) from the charge pump circuitry. An amplifier (e.g., operational amplifier) 612 can be provided to bias the current mirror 602. The amplifier 614 has a first input connected to the second input terminal 614, and a second input connected to the first input terminal 608. The output of the amplifier 612 is coupled to the commonly connected gate terminals of the transistors 604 and 606. The biasing provided by the amplifier 612 operates to configure the first transistor 604 to draw a current load commensurate with or proportional to the current load imposed on the output terminal of the charge pump circuitry. The current through the first transistor 604 is also mirrored to produce a like (or scaled-down) current through the second transistor 606. The mirrored current through the second transistor 606 is then compared with a reference current established by a current source 616. The comparison signal (Sc) produced at the output terminal 610 represents a comparison of the reference current and the mirrored current.

Figure 7:
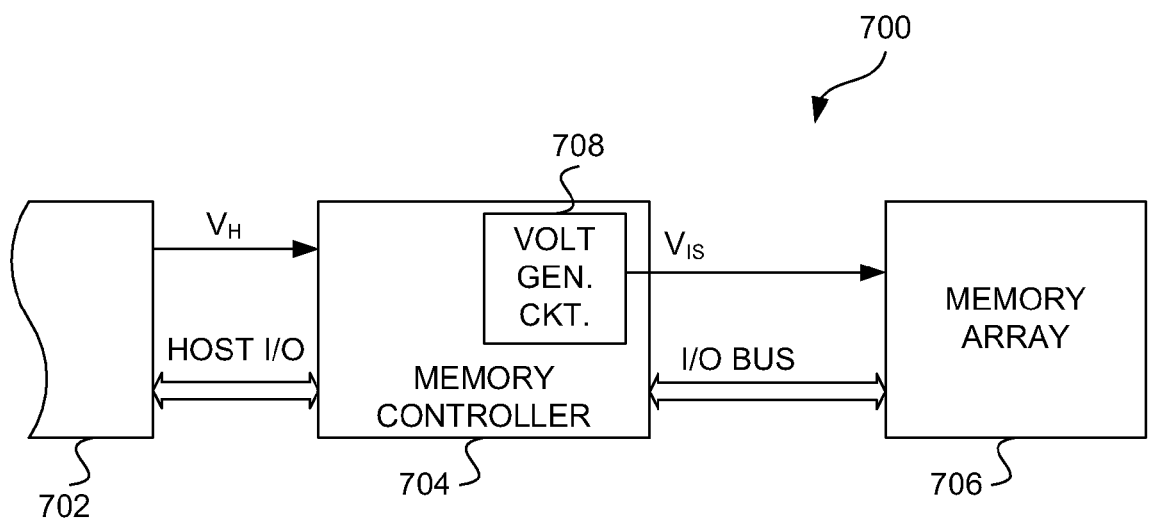
FIG. 7 is a block diagram of a memory system according to one embodiment of the invention.

FIG. 7 is a block diagram of a memory system 700 according to one embodiment of the invention. The memory system 700 is, for example, associated with a memory card (such as a plug-in card), a memory stick, or some other data storage product. Examples of a memory card include PC Card (formerly PCMCIA device), Flash Card, Flash Disk, Multimedia Card, and ATA Card. The memory system 700 can also be referred to as a memory product or a removable data storage product or a portable data storage product.

The memory system 700 cooperates with a host 702. For example, the host 702 can be a computing device, such as a personal computer. In particular, the memory system 700 stores data that can be utilized by the host 702. The memory system 700 and the host 702 can communicate over a host Input/Output (I/O) bus. The host 702 provides a host voltage ($V_H$) (i.e., supply voltage) to the memory system 700. The memory controller 704 couples to the host I/O bus and the host voltage ($V_H$). The memory controller 704 couples to a memory array 706 using an I/O bus and at least one internal supply voltage ($V_{IS}$). The at least one internal supply voltage ($V_{IS}$) is generated by a voltage generation circuit 708 provided within the memory controller 704. Although the embodiment of the memory system 700 shown in FIG. 7 produces the at least one internal supply voltage ($V_{IS}$) at the memory controller 704, it should be understood that the voltage generation circuit 708 can produce any number of a plurality of different supply voltage levels that would be needed by the memory array 706. The voltage generation circuit 708 can correspond to any of the voltage generation circuits discussed herein.

The level of the voltages can vary with implementation. As one example, the host voltage ($V_H$) might be 3.3 or 1.8 volts, and the level of the internal supply voltage ($V_{IS}$) might be 6.5 volts, 15 volts or 30 volts. Moreover, although the voltage generation circuit 708 is illustrated in FIG. 7 as being internal to the memory controller 704, in alternative embodiment, the voltage generation circuit 708 can be (i) internal to the memory array 706 or (ii) separate from either the memory controller 704 or the memory array 706.

The memory array 706 provides an array of data storage elements that provide non-volatile digital data storage. In one embodiment, the data storage elements are electrically programmable and electrically erasable, such as EEPROM or FLASH devices. For example, the data storage elements can be based on floating-gate devices, diodes or antifuses. The memory array 706 can include one or more semiconductor dies, chips or products. The memory array 706 can include data storage elements. The memory controller 704 is also often a separate semiconductor die, chip or product.

As used herein "operatively connected" refers to direct or indirect electrical connection between electrical components.

The various features, aspects, embodiments or implementations can be used alone or in any combination.

The invention can pertain to a memory product that provides data storage. The memory product can, for example, pertain to a semiconductor memory product, such as a semiconductor memory chip or a portable memory card.

The invention can further pertain to an electronic system that includes a memory system as discussed above. A memory system (or memory device) can include at least a memory array that provides data storage. Memory systems (i.e., memory cards) are commonly used to store digital data for use with various electronics products. The memory system is often removable from the electronic system so the stored digital data is portable. The memory systems according to the invention can have a relatively small form factor and be used to store digital data for electronics products (e.g., consumer electronic products) that acquire data, such as cameras, hand-held or notebook computers, network cards, network appliances, set-top boxes, hand-held or other small media (e.g., audio) players/recorders (e.g., MP3 devices), personal digital assistants, mobile telephones, and medical monitors.

The invention is suitable for use with both single-level memories and multi-level memories. The memories or memory blocks are data storage devices that include data storage elements. The data storage elements can be based on semiconductor devices (e.g., floating-gate, diode, antifuse, etc.) or other types of devices. In multi-level memories, each data storage element stores two or more bits of data.

The advantages of the invention are numerous. Different embodiments or implementations may yield one or more of the following advantages. One advantage of the invention is that memory devices can be intelligently operated to satisfy performance specifications or requirements. Another advantage of the invention is that through measurement of an electrical characteristic of a memory device, an electrical load of the memory device can be accurately measured and thus used in managing the electrical load being imposed by the memory device.

The many features and advantages of the present invention are apparent from the written description. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A method for generating a voltage for electronic circuitry within an integrated circuit package, said method comprising:

generating a regulated voltage from a lower supply voltage;

supplying the regulated voltage to the electronic circuitry, the electronic circuitry imposing an electrical load on the regulated voltage;

monitoring the electrical load on the regulated voltage due at least in part to the electronic circuitry; and altering operability of the electronic circuitry based on the monitored electrical load.

2. A method as recited in claim 1, wherein said altering operates to reduce the electrical load based on the regulated voltage by the electronic circuitry based on the monitored electrical load.

3. A method as recited in claim 1, wherein the electronic circuitry includes a memory array including a plurality of memory elements, and wherein said altering limits the operability of the memory array by reducing the number of number of memory elements that are able to be concurrently written.

4. A method as recited in claim 1, wherein said altering comprises:

determining whether the monitored electrical load is greater than a first predetermined threshold; and restricting operability of the electronic circuitry when it is determined that the monitored electrical load is greater than the first predetermined threshold.

5. A method as recited in claim 4, wherein the electronic circuitry includes a memory array including a plurality of memory elements, and wherein said restricting restricts read or write access bandwidth so as to reduce the monitored electrical load.

6. A method as recited in claim 4, wherein said altering further comprises:

subsequently determining whether the monitored electrical load is less than a second predetermined threshold; and unrestricting operability of the electronic circuitry when it is determined that the monitored electrical load is less than the second predetermined threshold.

7. A method as recited in claim 6, wherein the electronic circuitry comprises a memory array of non-volatile memory elements.

8. A method as recited in claim 1, wherein the electronic circuitry comprises a memory array of non-volatile memory elements.

9. A method as recited in claim 8, wherein the non-volatile memory elements are diode-based memory elements.

10. A method as recited in claim 1, wherein the electronic circuitry comprises a memory array of non-volatile memory elements, and wherein the integrated circuit package is a portable and removable data storage product.

11. A method for operating a portable and removable data storage product, the portable and removable data storage product includes a memory array of non-volatile memory elements, said method comprising:

generating a regulated voltage from a lower supply voltage;

supplying the regulated voltage to the memory array, the memory array imposing a load on the regulated voltage;

monitoring an electrical load due at least in part to the load imposed on the regulated voltage by the memory array; and controlling access to the memory array based on the monitored electrical load.

12. A method as recited in claim 11, wherein the electrical load is a current load due at least in part to the load imposed on the regulated voltage by the memory array.

13. A method as recited in claim 12, wherein the non-volatile memory elements are diode-based memory elements.

14. A method as recited in claim 11, wherein said controlling limits the operability of the memory array by reducing the number of number of the non-volatile memory elements that are able to be concurrently written.

15. A method as recited in claim 11, wherein said controlling comprises:

determining whether the monitored electrical load is greater than a first predetermined threshold; and restricting operability of the memory array when it is determined that the monitored electrical load is greater than the first predetermined threshold.

16. A method as recited in claim 15, wherein said restricting restricts read or write access bandwidth to the memory array so as to reduce electrical current load.

17. A method as recited in claim 15, wherein said controlling further comprises:

subsequently determining whether the monitored electrical load is less than a second predetermined threshold; and unrestricting operability of the memory array when it is determined that the monitored electrical load is less than the second predetermined threshold.

18. A method as recited in claim 15, wherein the electrical load is a current load due at least in part to the load imposed on the regulated voltage by the memory array.

19. A method as recited in claim 18, wherein the non-volatile memory elements are diode-based memory elements.

* * * * *